US007106045B2

(12) United States Patent
Jungwirth et al.

(10) Patent No.: US 7,106,045 B2
(45) Date of Patent: Sep. 12, 2006

(54) APPARATUS FOR A SIMPLIFIED POWER DISTURBANCE INDICATOR GAGE WITH LEARNING CAPABILITY OPTIONS

(75) Inventors: Gary Jungwirth, Nekoosa, WI (US); Michael W. Hogan, New Lisbon, WI (US); Teresa A. Kamper, Camp Douglas, WI (US); Gregory C. Kohls, Nekoosa, WI (US); Stephen J. Paul, Camp Douglas, WI (US)

(73) Assignee: UPPI Corporation, Friendship, WI (US)

( * ) Notice: Subject to any disclaimer, the term of this patent is extended or adjusted under 35 U.S.C. 154(b) by 16 days.

(21) Appl. No.: 09/902,318

(22) Filed: Jul. 10, 2001

(65) Prior Publication Data

US 2003/0016004 A1    Jan. 23, 2003

(51) Int. Cl.
*G01R 13/04* (2006.01)
(52) U.S. Cl. ........................ 324/113; 324/107
(58) Field of Classification Search ............ 324/103 R, 324/142, 512, 514, 521–522, 113, 126–127, 324/107; 340/657, 870.02, 635
See application file for complete search history.

(56) References Cited

U.S. PATENT DOCUMENTS

| 4,187,461 | A |   | 2/1980  | Cox |
|-----------|---|---|---------|-----|
| 4,362,986 | A | * | 12/1982 | Burke et al. ................. 324/500 |
| 4,734,639 | A | * | 3/1988  | Saletta et al. ............... 324/107 |
| 5,481,468 | A |   | 1/1996  | McEachern |
| 5,514,969 | A |   | 5/1996  | Moore et al. |
| 5,530,738 | A |   | 6/1996  | McEachern |
| 5,574,654 | A |   | 11/1996 | Bingham |
| 5,819,203 | A |   | 10/1998 | Moore et al. |
| 5,825,656 | A |   | 10/1998 | Moore et al. |
| 5,899,960 | A |   | 5/1999  | Moore et al. |
| 6,100,679 | A |   | 8/2000  | McCasland |
| 6,198,403 | B1| * | 3/2001  | Dorrough et al. ........... 340/635 |
| 6,404,348 | B1| * | 6/2002  | Wilfong ..................... 340/657 |

\* cited by examiner

*Primary Examiner*—Vinh P. Nguyen
(74) *Attorney, Agent, or Firm*—DeWitt Ross & Stevens SC; Charles S. Sara; Joseph T. Leone

(57) ABSTRACT

Disclosed is a simplified electrical power disturbance gage. The gage is capable of measuring high-speed anomalies on power mains. The gage includes elements capable of detecting power line anomalies that effect the operation of electrical devices connected to the power line.

7 Claims, 6 Drawing Sheets

APPARATUS FOR A SIMPLIFIED POWER DISTURBANCE INDICATOR GAGE WITH LEARNING CAPABILITY OPTIONS

CROSS-REFERENCES TO RELATED APPLICATIONS

Not applicable

FEDERAL SPONSORSHIP

Not Applicable

MICROFICHE APPENDIX

Not Applicable

BACKGROUND OF THE INVENTION

Field of the Invention

This invention relates to methods of measuring electrical power line quality by detecting and characterizing and indicating the magnitude of specific electrical anomalies and defects which occur on the power lines. It is known that these particular anomalies, and others, can affect the operation of sensitive electronic equipment which may be connected to the power lines.

In this apparatus, anomaly detection is limited to voltage range, voltage surges and sags, voltage dropouts, and voltage spikes or fast transients.

The particular elements measured in this gage have been selected because they occur extremely rapidly, have deleterious effects on connected equipment and machinery. Heretofore, line monitoring equipment that could respond to such fast events required an experienced technician with complex equipment to analyze the defects, their magnitude, and possible effects on the connected equipment. The present invention provides easily understood displays of existing power line anomalies and the disruptions that occur. These anomalies and disruptions can be either transient or periodic, long term, or short term. Although there are many other types of anomalies, in this invention, such disruptions may consist of, but for the sake of simplicity, measured disruptions in this invention have been limited to: Line voltage fluctuations such as surges and sags, transient phenomena such as positive and negative directed spikes, glitches or line dropouts, and nominal voltage fluctuations. These are the major line defects which usually affect equipment operation. The gage can measure the number of cycles of the observed outage, where one cycle is equal to 16.6 milliseconds when the line frequency is 60 cycles per second (Hertz) and to 20 milliseconds when the frequency is 50 cycles per second (Hertz). Simple colored LED displays, or colored incandescent displays and Bar-Graph readouts provide information as to the type of defects observed and their duration. Accordingly, the user needs no technical training to use the gage of the present invention.

Background of the Invention

There are many good line quality meters in use today. The primary problem with these instruments is that the good gages are very complex, and most often require an engineer or highly trained technician to analyze the data that is taken, in order to determine the nature of the power line anomalies that are present. As a result, these gages, while performing well, become virtually useless to the non-technical user who simply wants to know if his equipment failures are caused by problems that are directly related to the quality of his power lines.

The primary object of the present invention, therefore, is to determine whether there are anomalies on the power lines which can affect the quality of the incoming power, specifically, as such quality is related to the performance of the machines or equipment being powered.

The present invention provides simplified displays which do not require extensive training of the personnel who must use the gage. An untrained technician can use the present invention and know immediately whether line deficiencies exist, what type of power line difficulties exist, and the possible related effects on his connected equipment. The gage also shows when there are no line anomalies. The absence of line anomalies becomes very significant when equipment is malfunctioning, and the cause is not known.

The present invention will monitor the AC line voltage and determine and display the true AC line nominal RMS (Root Mean Square) voltage. Spikes, surges, and sags will be referenced to the measured true nominal line voltage. Where necessary, critical load characteristics and rated voltages can be pre-entered into the gage so that significant variations therefrom can be identified as potential problem sources.

There are types of electrical equipment and machinery which are very prone to failure when there is a very short line voltage dropout or when a very short (¼ of a cycle) line transient impulse occurs, while at the same time exhibiting no failure when the AC line is experiencing a surge or a sag. Sensitivities to this type of transient power line failures are very difficult to find and quantify because of their short duration. There are other equipments or machinery which are sensitive to surges and sags but do not suffer when there is a line transient present.

An important secondary feature of the present invention is the ability to compare the instantaneous variations of the power mains, and also the specifications of the equipment being protected, and finally, for the power quality metering equipment of the present invention to adjust itself so that the reported anomalies are those which can affect the equipment being protected, thus preventing false alarms.

In those cases where line voltage transients, dropouts, surges and sags do not affect the powered equipment, these anomalies need not be considered as line defects. This situation can vary from one connected equipment to another connected equipment. (Often referred to as the "critical load"). It becomes very important to be able to identify what power line defects affect the electrical equipment or machinery that is powered by the power lines, and to develop a method of measuring those defects which do affect the equipment operation or performance.

The simplified disturbance indicator of the present invention continually monitors the AC power lines for specific anomalies, and displays them when they exist. As an option, the gage of the present invention is able to "learn" which power line conditions do not affect the connected equipment, and can then display those defects which are known to affect the connected equipment.

Despite the improved capabilities, the gage remains easy to read and understand, without the need for advanced training. The average electronic technician can learn to read and analyze the readouts of this gage in just a few minutes. The displays are either illuminated colored lights or alphanumeric displays. No conventional meters or oscilloscopes are required.

Field Problems Solved by this Invention

Power Quality has caused extreme concern during the past decade, and continues to be a problem. Electronic equipment has become more complex, and most industrial and many commercial systems today are controlled by some kind of computer or computerized system. However, computers are not the only problem area. Despite advances in electronic technology, there are innumerable systems, which still employ relay controlled logic for their operation. Unfortunately, these relay operated systems are extremely susceptible to short AC line dropouts, because unless relays in the equipment have been latched, many relays cannot tolerate dropouts of a four or more milliseconds.

In a typical situation, computer or relay controlled machinery has failed to operate for "mysterious causes". When called in for a service call, the manufacturer's technician tells the user that the failure was due to a "defective synchronizer board but do not worry, we will send you an immediate replacement". This response has made the customer feel comfortable, but when the new synchronizer board arrives, and is installed in the machine, the problem re-appears. We have discovered that often, the problem is not with the electronics, but with the sensitive relays which control the operation of the machinery. This is especially true of pre-computer systems, where the control logic is composed of relays. Typical relays used in these applications have been found to be typified by those manufactured by Struthers-Dunn/Magnecraft 314/215, MEC series GV relays. Identical relays are manufactured by Potter and Brumfield and other companies. These octal-based relays have been selected by designers because they are "pluggable" and readily replaced in the field. Even a small dropout of AC power for as little as four milliseconds (0.004 seconds) can cause the relays to malfunction and system to fail.

An important, and often overlooked feature of a power disturbance gage, as in the present invention, is the ability to reveal when there are no defects on the power lines. Very often mal-function of a piece of machinery is blamed on the power line having disruptions or other anomalies. In an actual case, when the power disturbance gage of the present invention revealed that there were no defects in the power mains, a further examination revealed that the equipment being serviced was failing due to a clogged filter element.

Furthermore, small transients have been known to disrupt sensitive electronic equipment, and many devices have been developed to immunize equipment from the effects of power-related problems.

These devices which protect the power mains include capacitors, semiconductor energy absorbers, complete line noise filters, and Uninterruptible Power Supplies, (UPS) which can provide backup electrical power in the event that the power mains become corrupted or the source of voltage vanishes completely. Other types of UPS include line reactive power systems which actually can provide artificial notches of power to fill the non-periodic momentary voids which appear in the power grid. Power corruption of the Alternating Current power lines (or power mains) can include power line transients, voltage dropouts, voltage surges, voltage sags, phase shifts, phase loss, current dropouts, complete loss of power, phase delays and other unusual anomalies.

A common method of power protection has been the design of power-line monitoring equipment which can actually detect and measure the extent of power line anomalies, and thereby control the power protection devices which are connected to the power mains and then supply auxiliary power to the load. For example, if there is a momentary dropout or loss of electrical power, a battery powered backup supply can provide stored energy to fill the gap produced by the power dropout. Such interactive power protection is costly and requires routine maintenance.

During the past decade, however, the industry has grown, and power line detection devices have become very sophisticated. Some detection devices can verbally announce a power-line problem. There are protection devices which can analyze the trends on a power line and even predict that there is very likely to be a power outage or a power problem before the problem actually exists.

Sensitive line power outage detectors often cause false alarms or cause the backup power supply to become active unnecessarily. This activity shortens battery life, and increases the need for expensive maintenance. One of the major problems with the present power line detection devices is that they are extremely complicated and as a result, these line detection devices are difficult to use and are even more difficult to understand. Often, an engineer or specially trained technician is required to analyze the readouts in order to determine what the AC power problem is. Clearly, what is needed is a Power Disturbance Indicator which provides a simplified readout defining the line power problems, without the need for interpretation or interpolation. The present gage is designed to fill that need.

Design Engineers are faced with two problems which must be solved. A power gage must readily and clearly identify line power problems, and be able to respond to changes in product design and sensitivities Equipment manufacturers have not ignored the problems. Out of necessity, they have designed their newer equipments to be more immune to power line disturbances. As an example, power supplies of computers have been reinforced by the addition of larger filtering elements which are capable of absorbing the energy in line transients, and capable of withstanding significant line surges and dropouts without affecting the computer or machinery performance.

This "hardening" of electronic equipment has done several things for the industry. First, the need for very sophisticated line power monitoring equipment has been reduced, and the overall reliability of the electronic equipment has been greatly enhanced.

With the advent of "hardened" systems, the need for power line disturbance analyzers has changed. No longer does a line monitor need to respond to tiny glitches in line power, or to small line transients. In some cases, power line surges or voltage sags can be tolerated without affecting the attached equipment.

In many cases, where relays are not used for control logic, complete power dropouts for a portion of a cycle can pass through the system unnoticed.

Furthermore, the line Power Disturbance Indicator must be able to operate with all AC standard line voltages and with either single phase or polyphase power. (Generally, polyphase power is three-phase power, but some electrical power systems use more than three phases. For example, steel mills use six phase power for their large motor and control systems.)

Another use for the present invention is to alert the operator to the root cause of the electrical problem in his power grid so that necessary precautions and corrections may be taken, or the cause of his problem may be accurately determined, and corrected.

2.0 Related Art (Prior Art)

There are many types of line monitors that have been patented. Most however, are very complex, difficult to use, and to understand.

The following patents, though not totally inclusive, are typically indicative of the prior art in this field.

1. U.S. Pat. No. 5,574,654. "Electrical Parameter Analyzer". Inventor Richard P. Bingham et al, Issued Nov. 12, 1996, assigned to Dranetz Technologies Inc.

This invention describes a programmable analyzer for characterizing an electrical power supply.

2. U.S. Pat. No. 5,530,738. "Electric Power Measuring Equipment with Speech Synthesis Feature" Inventor, Alexander McEachern, Issued Jun. 25, 1996. Assigned to Infrastructure Instruments Inc. This invention describes a method for analyzing an AC power mains and reporting the measured characteristics by means of a speech synthesizer.

3. U.S. Pat. No. 5,541,468. "Method and Apparatus for Storing an Increasing Number of Sequential Real-time Samples in a Fixed Amount of Memory". Inventor, Alexander McEachern, issued Jan. 2, 1996. Assigned to Basic Measuring Instruments Inc.

This invention describes a method for storing an increasing number of data points such as those encountered in alternating current power line parameters by employing a technique for data compression so as to maximize the amount of stored data within a limited size of memory.

4. U.S. Pat. No. 6,100,679. "Voltage Indicating Instrument." Inventor: Thomas A. McCasland. Issued Aug. 8, 2000. Assigned to Tasco Inc.

This invention provides a method for indicating the presence of dangerous voltages on an operative portion of a tool. Typically a modified screwdriver or nut driver is used as a probe.

5. U.S. Pat. No. 5,514,969. "Impedance Measurement in a High Voltage Power System". Inventor Robert A. Moore et al. issued May 7, 1996. Assigned to Reliable Power Meters, Inc. This invention uses voltage and current probes to compute output and load impedances of a high voltage power system. the invention removes the necessity to disconnect portions of the circuit to make these measurements.

6. U.S. Pat. No. 4,187,461 "Dynamic Threshold Impulse Directivity Indicator." Inventor: Philip P. Cox. Issued Feb. 5, 1980. Assigned to Dranetz Engineering Laboratories, Inc This invention describes a method for detecting an impulse voltage by comparing its level with an automatically determined threshold.

7. U.S. Pat. No. 5,825,656. "Apparatus and Method for Power Disturbance Analysis by Display of Power Quality." Issued Oct. 20, 1998. to Moore et al. Assigned to Reliable Power Meters, Inc 8. U.S. Pat. No. 5,825,656. "Apparatus and Method for Power Disturbance Analysis by Display of Power Quality Information." Inventor: Moore, et al. Issued Oct. 20, 1998. Assigned to Reliable Power Meters, Inc. This invention samples the AC power to derive Total harmonic distortion, Total power, and reactive power. these attributes are displayed as a vector superimposed on a three-axis graph having total power as one axis, reactive power as a second axis, and total harmonic distortion as a third axis.

9. U.S. Pat. No. 5,899,960. "Apparatus and Method for Power Disturbance Analysis by Display of Power Quality Information." Inventor: Moore et al. Issued May 4, 1999. Assigned to Reliable Power Meters, Inc. This invention describes a power monitoring system with associated signal processing and storage capabilities. each leg of a three phase power signal is simultaneously sampled on a plurality of channels to capture the instantaneous content of the power signal without time-skewing between the channels.

10. U.S. Pat. No. 5,819,203. "Apparatus and Method for Power Disturbance Analysis and Storage." Inventor Moore et al. Issued Oct. 6, 1998. Assigned to Reliable Power Meters, Inc. In this invention, historical data for an electrical signal is retained and displayed by dividing the electrical signal in the time domain into segments.

BRIEF SUMMARY OF THE INVENTION

The invention described herein, an apparatus for a Simplified Power Disturbance Indicator with optional learning capability, is a simplified gage with limited measurement capabilities. The gage has been specifically designed to provide primary power line performance information which is readily understood by the user, without the need for special training. Line RMS voltage, both three phase, and single phase, is measured and displayed on a numerical display. AC power line surges, sags, and transients are measured and displayed. LED bar-graphs tell the operator how long the defect has persisted. Anomalies as short as ½ cycle (0.008 seconds) are displayed. The displays automatically latch so that the captured defects are "remembered" until the display circuits are reset by the operator. When required, a learning option enables the gage to set its own baseline from previously measured data, or the operator can input known characteristics of the equipment being powered by the AC mains so that only those line defects which can cause the attached equipment to potentially fail are displayed. Such input data can be entered to the system of the present invention from another computer, a hand-held programmer or the like, by means of a provided data input connector which can accept data on a USB (Universal Serial Bus), an RS232 or RS488 data bus, or a parallel data bus. External data inputs are optically isolated for safety. The foregoing and other features of the present invention will become more apparent from the following description and accompanying drawings.

Here, the main power is connected to the system. Single phase power or three-phase power may be connected to the Power Disturbance Indicator connection module of the present invention. The operator can select the wiring interfacing, the voltage range, and whether the three phase power is supplied by a DELTA or a WYE power source. Note: the terms "Delta" and "Wye" are conventional and standard terms for identifying the types of three phase electrical connections, accepted within the industry.

Figure 5:
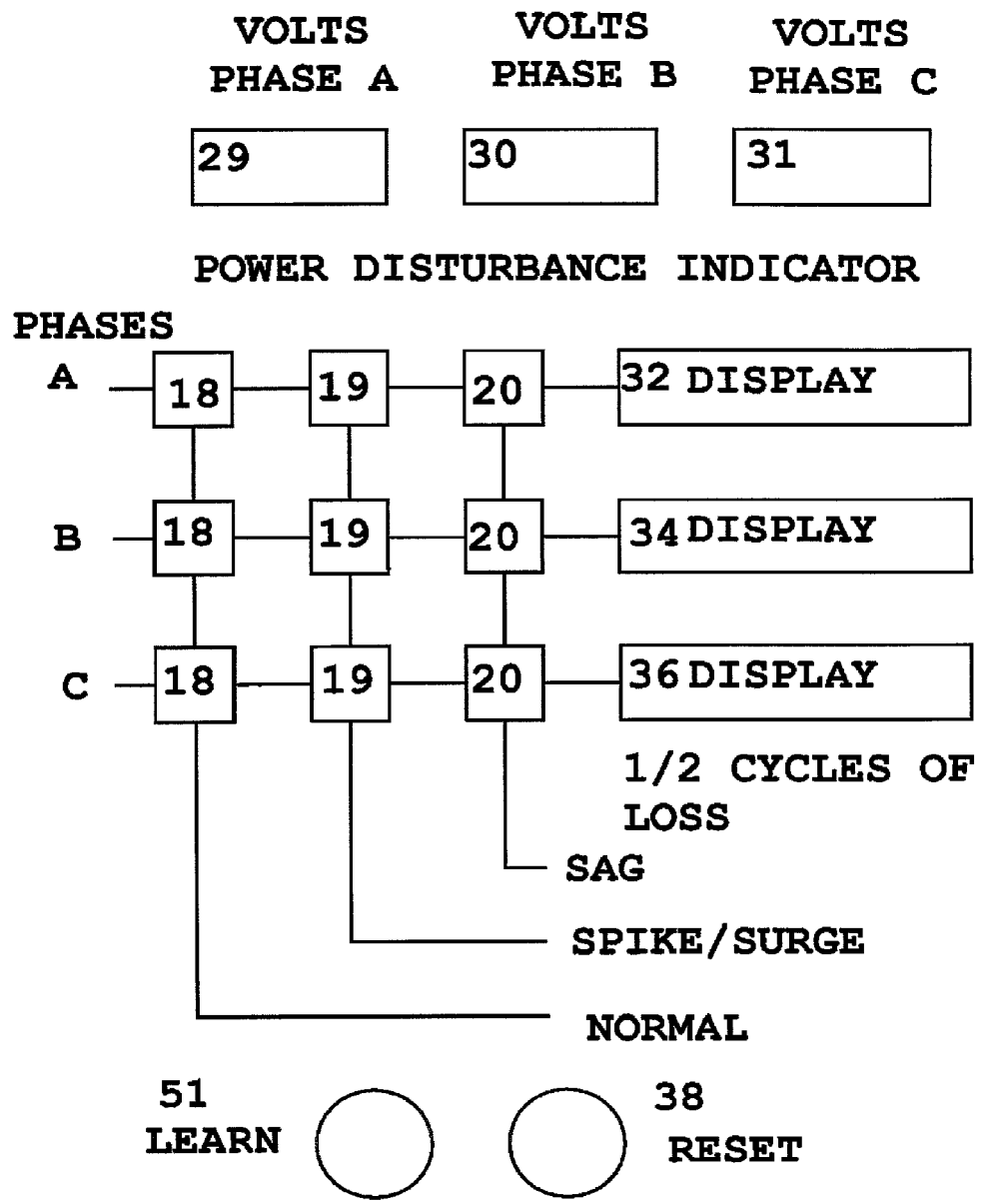

FIG. 5. Illustrates the display panel of the Power Disturbance Indicator of the present invention. The display is centered around a three phase power panel, indicating voltages and power disturbances for phases A, B, and C, When single phase power is used, Phase A represents the single phase input, and the other phase displays, which are isolated, can be used to monitor such items as single phase load voltages or uninterruptible power supply (UPS) output simultaneously. Colored LED (light Emitting Diode indicators) for each input tell the operator whether the power line is normal, has experienced a spike or surge, or has suffered a sag in voltage, and for how long these defects have persisted. Displays are latching, and the operator can reset the displays once the data is observed. the latching enables the equipment to store the disturbing event. These events may take place during the night, when there is no one present to observe the event.

Figure 6:
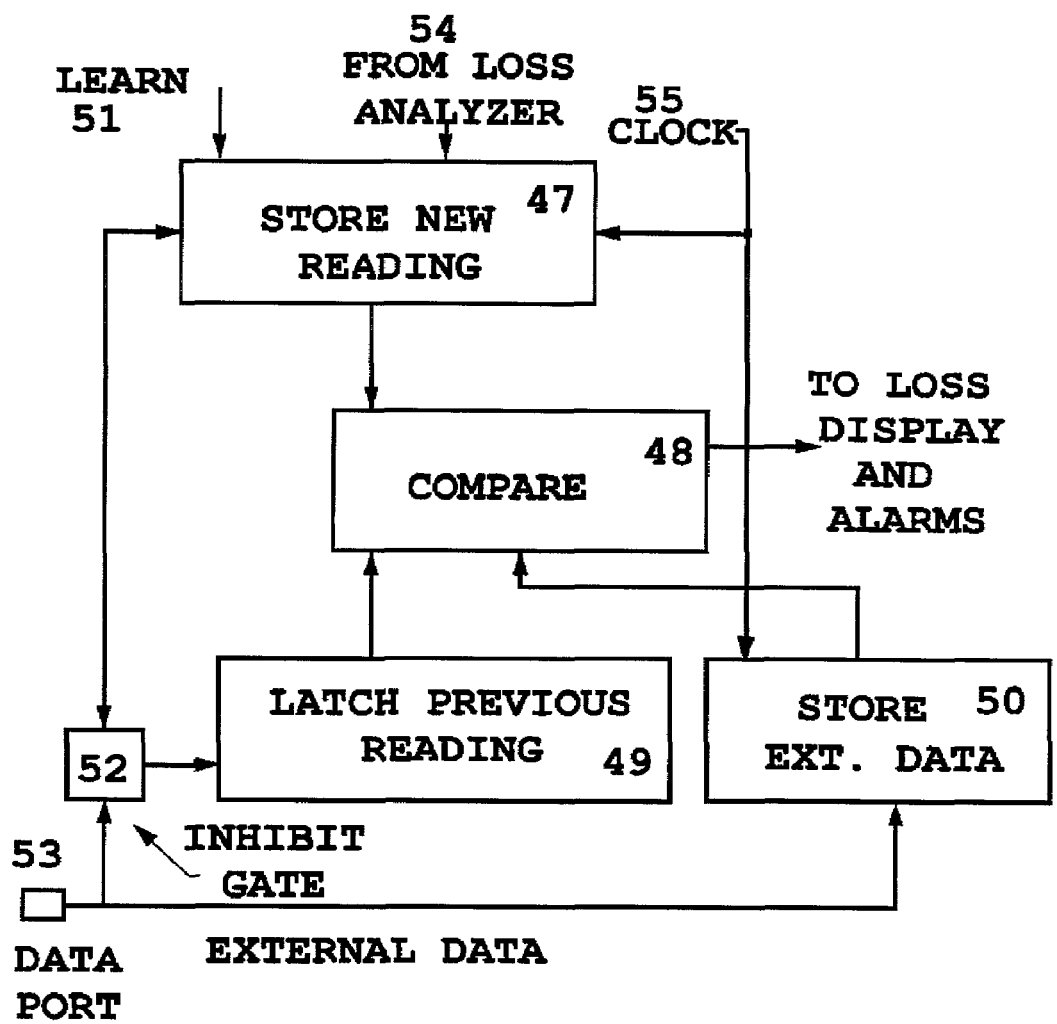

FIG. 6. Illustrates the basic diagram of the learning option. A similar option exists for each measurement channel.

DESCRIPTION OF SPECIFIC EMBODIMENTS

The embodiments of this invention are most clearly understood by means of block diagrams. While these block diagrams do not display specific functional details such as exact circuitry, the functional elements as described herein are well to known to those skilled in the art, and define the best mode for implementing the invention described herein. Circuits required to perform a specific task may change with developing technology, but the required task which is illustrated in the block diagram does not change.

Figure 1:
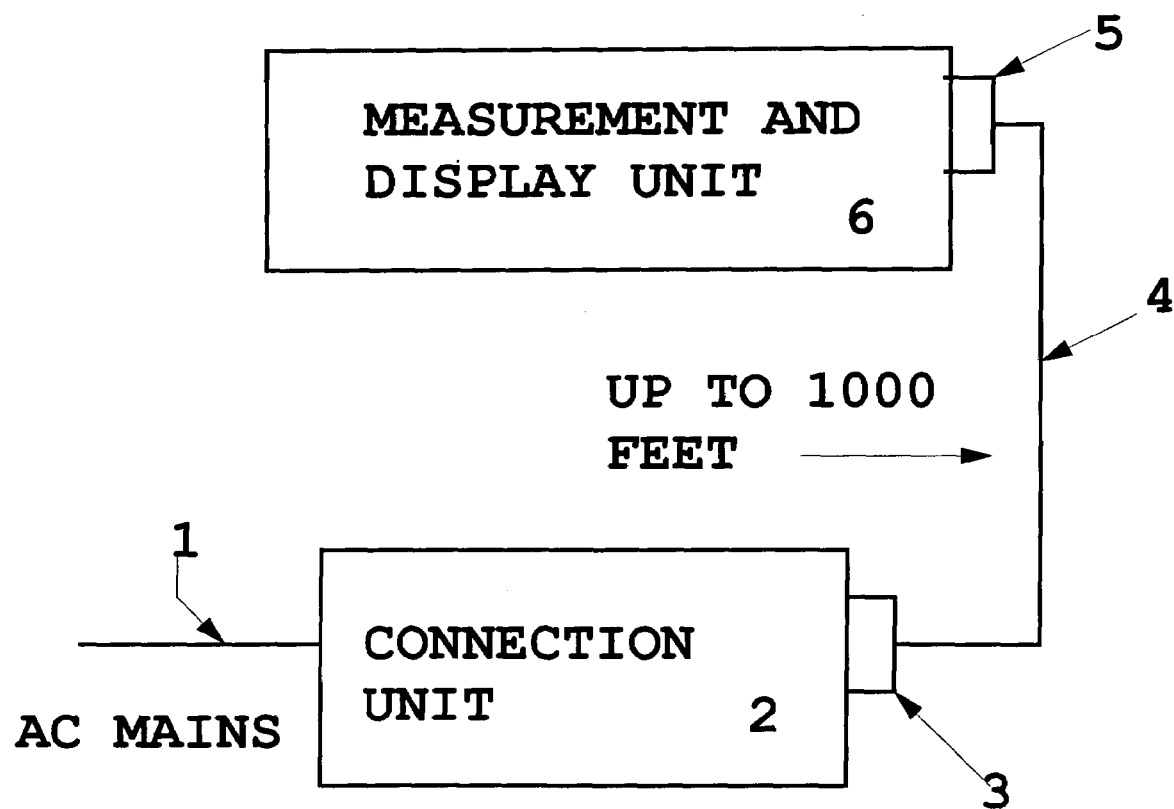
FIG. 1 Illustrates the basic interconnection of the system of the present invention. The AC mains or power lines are connected to the Connection module. The Connection module provides power and isolated data to the Measurement and Display module. These components are connected by a cable which may be up to 1000 feet in length.
Figure 2:
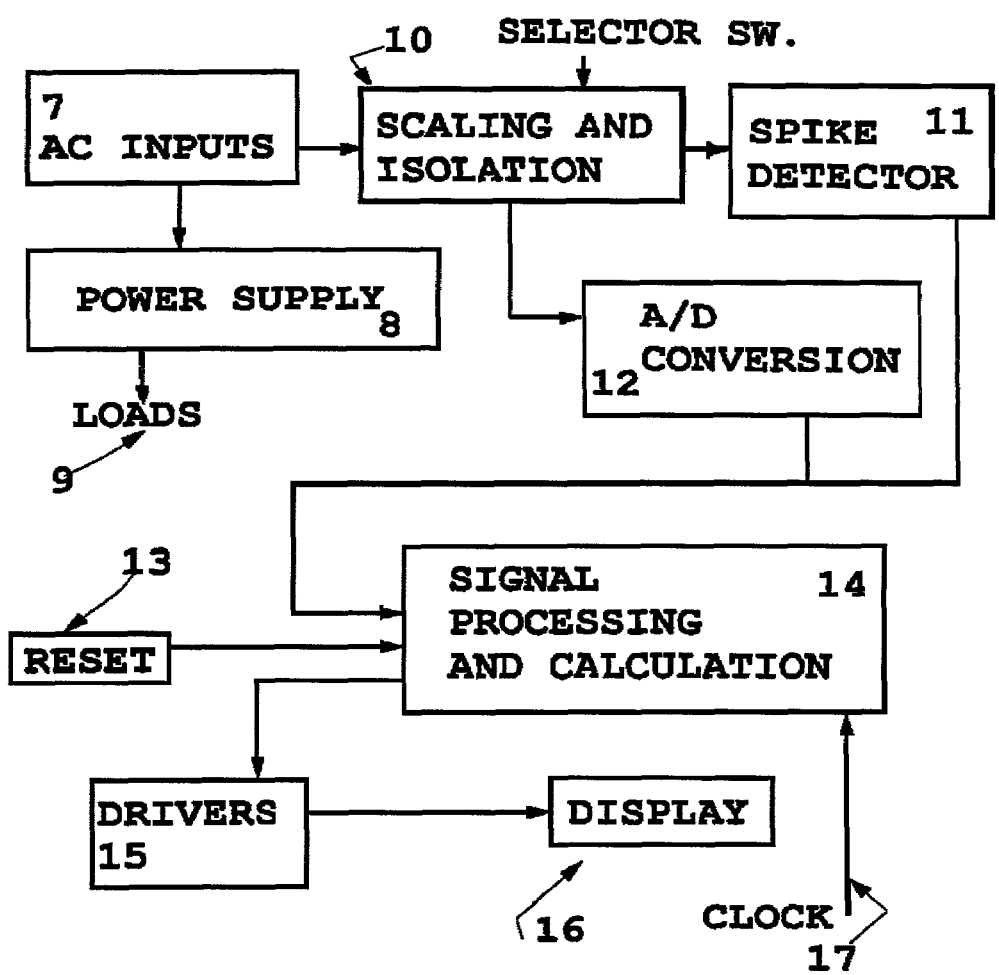
FIG. 2. Illustrates the basic measurement system of the Power Disturbance Indicator of the present invention. Although a plurality of such circuits are employed in a self-contained microprocessor, a single channel is illustrated in FIG. 2 for the sake of brevity and clarity.
Figure 4:
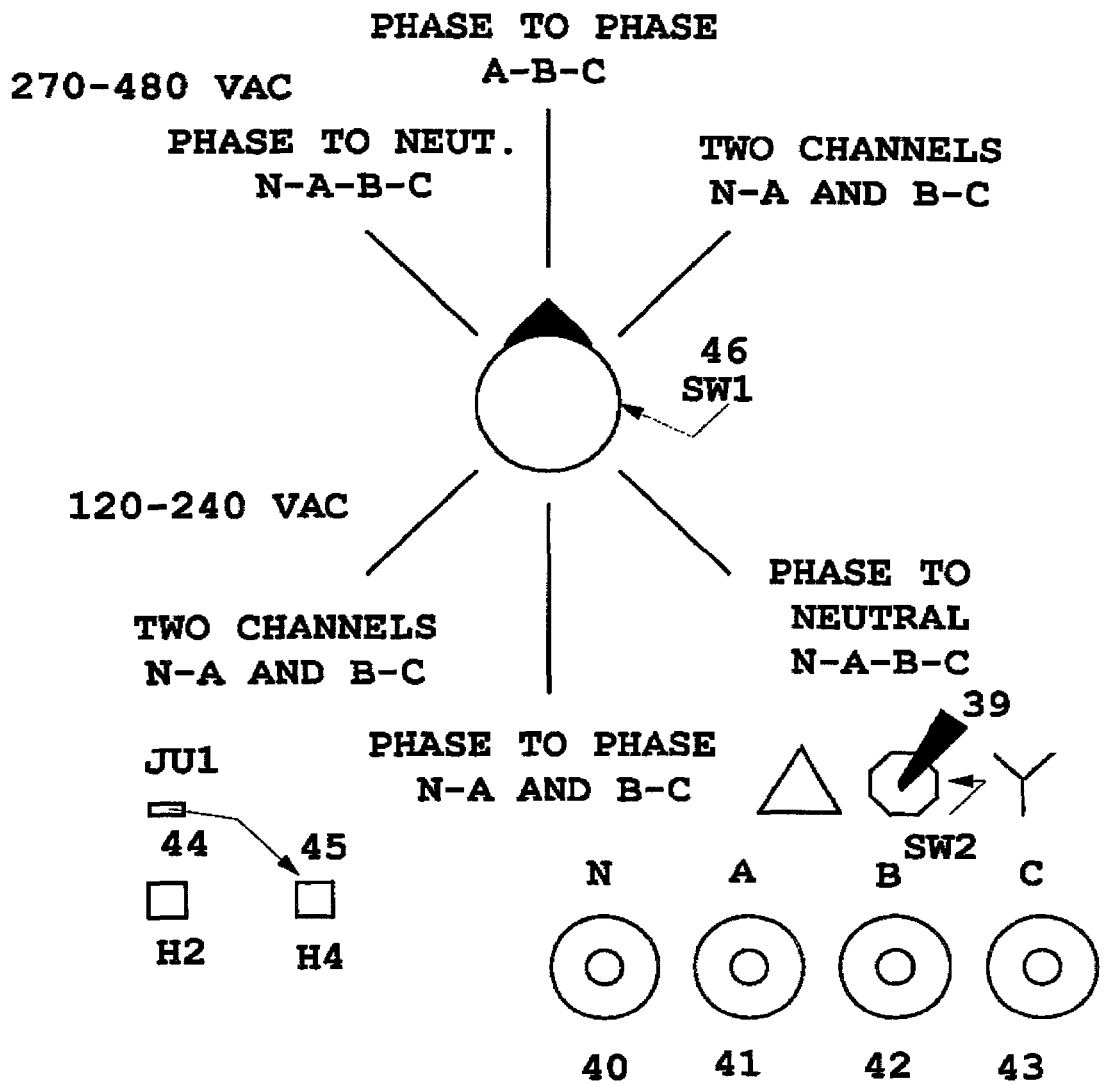
FIG. 4. Illustrates the manual switching section of the Connection module of the present invention.

FIG. 1 Illustrates the basic interconnection of the system of the present invention, which consists of two functional elements. These are the Connection Unit 2, and the Measurement and Display unit 6. These two units are interconnected by a cable assembly 4, which may be up to 1000 feet in length. In operation, the connection unit is preferably located close to the power source. For operator convenience, the Measurement and Display Unit 6 is located at the equipment being powered by the power source. If desired, both units may be located close to each other, or they can be integrated into a single functional device. Details of the connection unit are illustrated in FIG. 4. The Connection Unit 2 is connected to the AC mains 1 by means of conventional line connectors. 40, 41, 42, and 43. These terminals allow connection to single phase power, two phase power, or three phase power. In the connection unit, the operator selects the voltage type (three phase or single phase) the voltage range by means of the switch 1 46. The input voltage can range from 117 volts RMS through 480 volts RMS, and also whether the three phase power source is a DELTA connection or a WYE connection. This selection is made by means of switch 2 39. A voltage selector jumper J1 is used to select the operating voltage range. This one time selection is made during the initial installation, As shipped, the control panel is set up to operate at 277 volts RMS, Three Phase, DELTA connection. The jumper wire J1 is connected to the terminal marked H4. 45. If the voltage is less than 277 volts RMS, the jumper J1 must be moved to terminal H2 44

In FIG. 4, we also see the power input terminals. 40,41,42, and 43.

When single phase power is used, connection is made through the use of input jacks, A 41 and B 42

For three phase delta power connection, the connections are as follows:

| | |
|---|---|
| Voltage, Phase A | Connect to: A 41 and B 42 |
| Voltage, Phase B | Connect to: B 42 and C 43 |
| Voltage, Phase C | Connect to: C 43 and A 41 |

For a WYE connected input, the following connections are used:

| | |
|---|---|
| Voltage, Phase A | Connect to: N 40 and A 41 |
| Voltage, Phase B | Connect to: N 40 and B 42 |
| Voltage, Phase C | Connect to: N 40 and C 43 |

Figure 3:
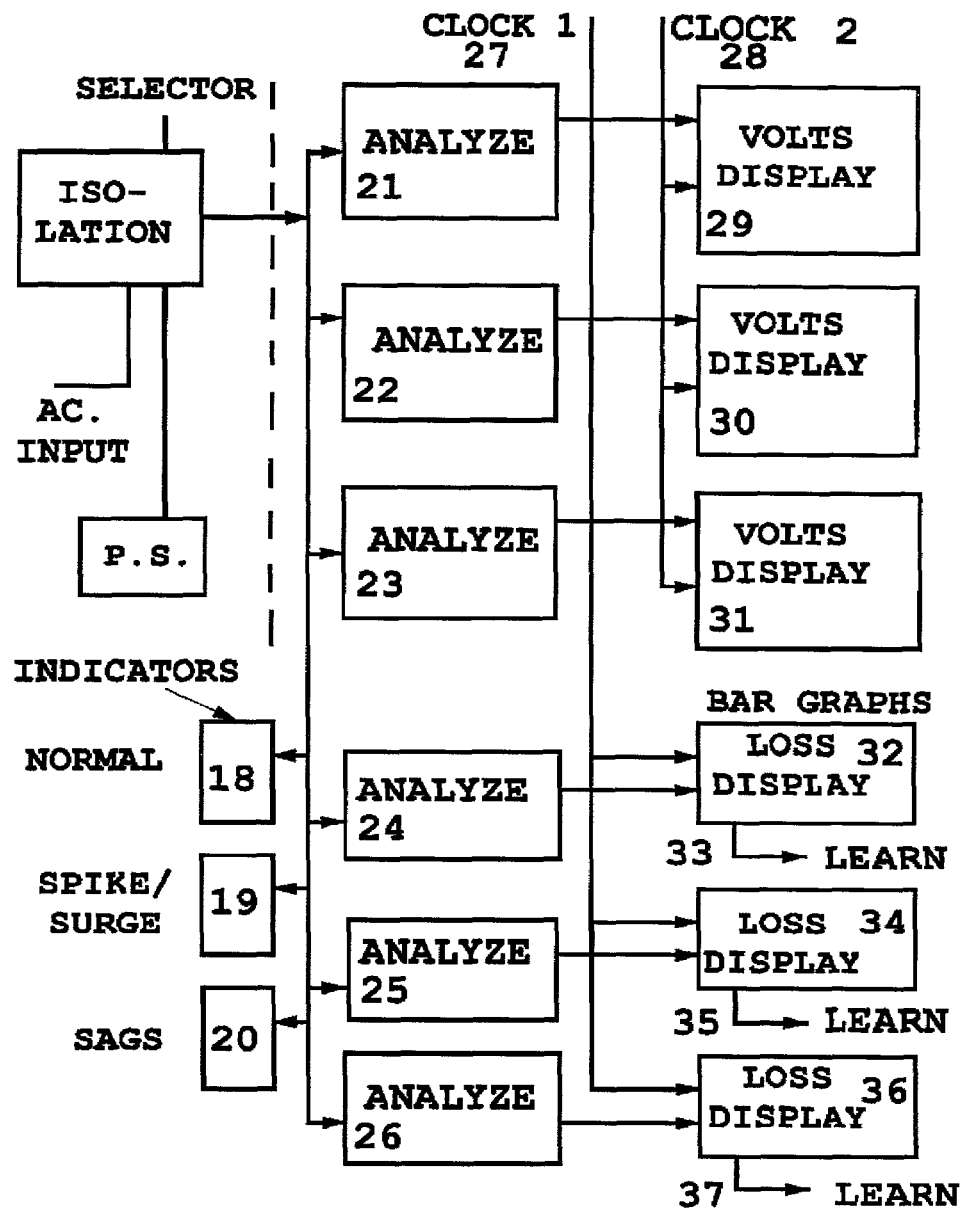
FIG. 3. Illustrates the block diagram of the Measurement and Display section of the Power Disturbance Indicator of the present invention.

The block diagram of the display logic is shown in FIG. 3. Here, the isolated voltage for each phase is fed into six analyzer circuits. Analyzers 21, 22, and 23, analyze the waveform and compute the RMS voltage for each phase. The output of these analyzers, whose circuitry and operation is well known to those skilled in he art, is converted to an equivalent DC level and is displayed on the respective voltage displays for each phase 29, 30, and 31 as an RMS alternating current voltage. All of the analysis, computations and comparisons, and logic elements are performed in a plurality of microprocessors, and support electronics consisting of transistors, gates, resistors, capacitors, and diodes.

The second set of analyzers 24, 25, and 26 are specialized anomaly detector circuits. These analyzers monitor each phase for normal voltage levels, spikes or surges, sags or dropouts in line voltage. When there is an anomaly, the duration of the anomaly is displayed on a bar graph associated with the type of loss and the phase that is affected. There are nine LED panel lights which are illuminated when a specific problem is encountered. These panel indicators are best illustrated in FIG. 5, which shows the performance of the power lines. The lights 18 (green), 19 (amber) and 20 (red) report what the displays are showing. This enables three displays to indicate combinations of eighteen possible problem areas. The displays are self-explanatory and no training is required to understand their meaning. Each display is latching, that is, they retain the last readings until a reset button is depressed by the operator. The latched outputs of the displays are also used in the learning option.

Turning back to FIG. 3, this part of the system is microcomputer controlled. Clock 1, 27 and clock 2, 28 provide the timing for the system. Clock 1, 27 provides the sample rate for the loss displays at 250 Hz, which clocks the displays at 0.004 seconds, or one quarter of a cycle. This clock rate allows the displays to resolve and display one-half cycle of the deficiency or loss. Clock 2, 28 provides the timing for the voltage displays, which are updated forty times a second. This high speed updating prevents any display flicker.

All timing is derived from the microprocessor, which is clocked at a frequency of 16 megahertz. This frequency is commonly used for microprocessors of the class used in this invention. It is important to note that microprocessors are constantly being developed, and many processors that presently exist and developed in the future may be used in this invention, without changing the fundamental intent of the invention.

FIG. 6. Illustrates the single channel basic diagram of the learning option. Note that three identical learning channels are used. Only one channel is shown for brevity. In this section, data from the loss analyzer or from the loss display is clocked into the first storage element. 47 by clock signal 55. The storage element holds the data between clocking pulses 55. The data that has been stored in the first storage element 47, is also transferred into the second latching element 49 which holds the value. This becomes the data of the "previous reading" when new data is applied to the first storage element. The newest reading is always stored in the first storage element 47. These two values are compared in comparator 48 and the resulting output is fed to the loss display. This simple scheme reveals the changes in the input as they occur.

When external data is applied to the latching circuit 49, through the input data port 53, the inhibit gate 52, prevents the measured data from being fed into the second latch. 49 when external data is present. The incoming data is stored in an external data register 50, and supplied as the input to the comparator 48. In this way, the external data is now compared with the actual measured data. Storage of the data is the learning option of the present invention.

In this option, the system can compare dynamically measured data or a pre-established data base for the equipment being surveyed by the gage of the present invention.

A hand-operated optional manual "learn button" 51 allows the operator to transfer external data into the comparator on demand, for data learning purposes.

This simplified block diagram is repeated several times once for each measurement channel. All circuitry represented here is embodied in the system microprocessor, Although this invention has been shown and described with respect to detailed embodiments thereof, it will be appreciated and understood by those skilled in the art that various changes in form and detail thereof may be made without departing from the spirit and scope of the claimed invention.

OBJECTS OF THE INVENTION

The primary object of the Simplified Power Disturbance Indicator of the present invention is to provide simple displays which tell the operator the nature of the electrical problems which may exist on the power mains without the need for complicated graphs, or analysis by experienced technicians or engineering professionals.

Another object of the universal Power Disturbance Indicator of the present invention is to be be capable of continuously monitoring standard single phase power, phase to neutral or phase to ground voltages in the range of 117 volts nominal to 480 volts nominal. In addition, the universal Power Disturbance Indicator shall be capable of measuring the voltage of each phase of a three phase power system, in either a WYE connected system or a Delta connected powered system. Single phase or Three Phase may be switch-selectable, with selectable voltage ranges from 117 volts to 480 volts RMS.

The displays on the Power Disturbance Indicator are dynamic, and continuously display line conditions with particular reference to deviations from normal operation. In general, the gage is meant to be used in this manner, showing the operator what is happening on his power grid. Short duration phenomena such as dropouts are displayed on latching bar graphs. The reading is latched B and displayed until reset by the user.

Another object is to provide an option whereby the Simplified Power Disturbance Indicator can be programmed to learn the characteristics of the connected critical load, byA, thus enabling the gage to display only those artifacts on the power mains which affect the performance of the electronic equipment connected thereto.

Object: Measurements

The universal Power Disturbance Indicator is used to measure and indicate:

The voltage of each monitored phase, either single phase or polyphase

The level of voltage sag or droop on each monitored phase

The presence of a transient voltage spike on each monitored phase

The presence and magnitude of a voltage surge or "swell" on each monitored phase The number of half-cycle voltage loss on each monitored phase, up to and including One to Ten Half-Cycles.

The difference between an input voltage and the output of a line conditioning device.

Object: Indicators

The universal Power Disturbance Indicator is equipped with conventional alpha-numeric Light Emitting Diode (LED) numerical indicators. These indicators depict the actual RMS voltage read on each phase of the input. When single phase power is utilized, the voltage levels shall be indicated on the "Phase A" indicator. The input voltages to all phases are isolated. Thereby allowing the phase B and phase C inputs to be used to sample various inputs or outputs on a single phase system. For example, on a single phase system, displays number one and two may be used to simultaneously monitor different portions of the single phase circuit, as for example, the input and output voltage of a line conditioner or Uninterruptible Power Supply.

Transient voltages and non-periodic events are indicated on bar-graph displays which latch the data for each type of event, with the bar graph showing the duration of the voltage surge, sag, or transient event. The present invention can be used with either a 60 Hertz power system or a 50 hertz power system. This one-time voltage range selection is made on the microprocessor board by a selector switch or a hard wired jumper at the time of installation.

The bar graphs can reveal the magnitude and quantity of line voltage transients. In like manner, a bar-graph shall indicate voltage surges on each phase, each sag or dropout on each phase. (A, B, or C) Where single phase power is tested, Phase "A" is used as the primary indicator. All graph data will be latched until the displays are reset.

When the Simplified Power Disturbance Indicator is used on three phase power, a switch activated by the user shall select whether the system being measured is a Delta connection or a Wye connection, and also select the nominal voltage of the system to be observed.

There are two fundamental modes of operation which can be selected by the operator.

These include both: "Manual" or "Automatic"

There shall be two Automatic modes: Operator Entry or Self-Teach

In the Manual, operator entry mode, the system dynamically and continuously reads the power lines and stores the accumulated anomaly readings. The displays are continuously updated with the last greatest anomaly magnitudes, with the bar graph displays always latching and remembering the last highest reading.

In the manual mode, no data is stored by the system. Dynamic line data is continuously displayed for the operator. Data comparisons are made against a known pre-installed data base.

Operator Entry Pre-Program Mode:

In the Operator Entry pre-program learn mode, the universal Power Disturbance Indicator can be programmed by the operator with the known characteristics of the electronic equipment attached to the gage as a load, and the indicators will not be illuminated until the incoming events reach or exceed 80 percent of the previously installed machine or process ratings For example, if the machine can absorb a transient of 1000 volts, there will be no transient indication until the transient has reached 800 volts or greater. Any selected amplitude can be used.

One important feature of the instant invention is the ability to detect very short dropouts of the AC power mains. This feature is extremely important when relay logic is used, and can determine problems which were previously undetected.

Operator Entry Learn Mode

In the operator entry learn mode, the universal Power Disturbance Indicator can read the incoming power lines and display the measured defects, displaying them on a combination of single indicators plus dynamic bar-type displays.

If these measured defects have not produced a machine malfunction, the operator now has the option of depressing a "learn" button. The action of the learn button will store the accumulated information, in internal memory banks, creating a dynamic data base. The data stored in memory can be downloaded to a printer or other display media. Thereafter, in the automatic mode, only magnitudes which exceed the stored values shall be displayed on the universal Power Disturbance Indicator readouts. An optional indicator can show that the readouts are based upon a learned data base.

For a new test, the operator can depress a reset button, and new values shall be measured from a zero baseline.

If the reset button is not depressed, new stored and indicated values will be those which are higher than the previously measured and stored values.

In the case where the measured values exceed assigned maximums, an alarm can be activated. Alarms will be audible and simultaneously normally open (producing a closure upon failure) relay contacts can be provided to activate ancillary equipment. Stored data can also be transmitted by radio, or over wires to remote indicating equipment.

The internal electronics of the gage may be powered by an internal battery. The battery may be rechargeable with power taken from the line being measured if necessary, during conditions when the power line is normal. The gage of the present invention will not be inconvenienced by loss of the power mains, and can function for a minimum of one hour on its internal battery pack, storing data during that period.

To facilitate connection to the power mains, a separate interface module, called a "connection unit" will be supplied as part of the invention. This first interface keeps the system microprocessor close to the lines being monitored. The second unit, called a measurement and display module can be located up to 1000 feet away from the interface module.

The display module can be located in a remotely located control panel. A terminal block assembly will facilitate connection to the mains being studied, but a simple cable assembly will be used to interface the display module to the monitor circuitry. When desired, both modules can be integrated into a single connection and display product Internal slide switches may be used to select voltage ranges and operating frequency. These are set during initial installation, and require no further adjustment.

Operation of the Simplified Power Disturbance Indicator with Learning Capability Options The Simplified Power Disturbance Indicator with learning capability is connected to the electrical power mains into which the machinery to be monitored, is connected. The complete gage consists of two units which are connected by a cable which may be up to 1000 feet in length. The first unit contains the microprocessor, and the second unit contains the display modules Initially all of the indicator lights, except those that are green (normal), are extinguished, indicating that the power mains are normal, (e.g.) They are within specification. Numerical displays can provide voltage readouts to the operator.

As power is utilized either by the connected machine or by other equipment connected to the mains, one or more of the other red or amber indicator lights may be illuminated, showing when some kind of anomaly has occurred.

If no harm has befallen the connected equipment (machine) as the result of the line abnormality, the operator then has the option of depressing the LEARN button and the accumulated data is impressed upon the memory. If the learn button is not depressed, the gage always reads from a nominal voltage and zero defect baseline.

When memory is selected, several things immediately begin to happen: (B) The data base becomes the values that were just entered into memory and (B) an amber light on the panel indicates that new data was just memorized by the Simplified Power Disturbance Indicator with learning capability Options.

This remembered data remains in a first data register until another event status is recorded and manually memorized as just described. In this event, the contents of the first register is dumped into a second register, and the new data is entered into the first register.

In this manner, the gage always contains two sets of line anomaly data. The data just measured and the data previously measured and stored in the data base (learned data). In each case, the base-line of the gage is constantly increasing, until a point is reached where the new data is accompanied by either an unstable condition of the machinery or a pre-determined maximum that is allowable for the machine, as determined by the specifications. These maximum values may be learned and are usually entered into a special register which stores the maximum values. This storage feature allows a comparison to be constantly made between the second register and the maximum register, When these two registers are equal, (or within a pre-set percentage of each other), an alarm may be sounded.

With the alarm, a control line is pulled down, causing the data in the second register to be transferred to the data displays. The displays now reveal the maximum operating levels of the AC line.

The system displays the maximum values which have been measured at the instant of the alarm. Note that the gage is constantly monitoring line RMS voltage, line peak voltage, line sags, line surges, and transient phenomena. Any of these may initiate the alarm, and the appropriate LED display chain, consisting of the type of defect, and its duration in half-cycles will be illuminated. A latching display or display driven memory will show the magnitude of the element which caused the display to function and optional alarm to sound.

When the second register has reached the maximum values, the first register contains a set of data which is lower in magnitude than the second or the maximum register. The differential magnitude is now part of the data base.

The invention claimed is:

1. An electrical power disturbance detection and indicator gage comprising:
 a measurement and display unit comprising a plurality of alpha-numeric displays, a plurality of light emitting diode indicators, a plurality of bar graph displays, a plurality of switches, multiple input terminals, and interconnecting cable and associated connectors operationally connecting the foregoing elements; and
 a connection unit interconnected to the measurement and display unit, the connection unit comprising a means for connection to a single phase or polyphase power mains, the means dimensioned and configured for determining existence and duration, or non-existence of power line anomalies which affect operation of electronic devices connected to a power line, and further comprising a manual switch to select a WYE or a DELTA connection for polyphase line power, and further comprising a means for memorizing anomalies detected from previous measured values.

2. The gage of claim 1, wherein the connection unit and the measurement and display unit, are interconnected by a cable assembly and weather proof connectors over a distance extending up to 1000 feet.

3. The gage of claim 1, wherein the alphanumeric displays are dimensioned and configured to display a nominal voltage from 117 volts RMS to 480 volts RMS.

4. The gage of claim 1, wherein the plurality of light emitting diode indicators are dimensioned and configured to display a specific anomaly selected from the group consisting of a voltage sag, a voltage spike or surge, or a normal voltage.

5. The gage of claim 1, wherein the bar graph displays are dimensioned and configured to display duration of each measured anomaly, wherein each bar segment of each bar graph represents a half-cycle of loss, wherein at a line frequency of 60 hertz, each half cycle represents a duration of 8.33 milliseconds, and wherein the bar graphs displays further comprise means for data latching to store displayed information.

6. The gage of claim 5, wherein the bar graph displayes are dimensined and configured to detect a line frequency of 50 hertz, and further wherein each bar segment represents a duration of ten milliseconds.

7. The gage of claim 1, wherein said means for memorizing is operationally connected to a data base which can be entered by an operator by means of a data port.

* * * * *